United States Patent [19]

Chao

[11] Patent Number: 4,514,829
[45] Date of Patent: Apr. 30, 1985

[54] WORD LINE DECODER AND DRIVER CIRCUITS FOR HIGH DENSITY SEMICONDUCTOR MEMORY

[75] Inventor: Hu H. Chao, Yorktown Heights, N.Y.

[73] Assignee: International Business Machines Corporation, Armonk, N.Y.

[21] Appl. No.: 454,777

[22] Filed: Dec. 30, 1982

[51] Int. Cl.³ ............................................ G11C 11/40
[52] U.S. Cl. .................................... 365/189; 307/449
[58] Field of Search ................. 365/189, 230; 307/449

[56] References Cited

U.S. PATENT DOCUMENTS

| | | | |
|---|---|---|---|
| 3,641,511 | 2/1972 | Cricchl | 340/173 |
| 3,757,310 | 9/1973 | Croxon | 340/172 |
| 3,778,782 | 12/1974 | Kitagawa | 340/173 |
| 3,786,277 | 1/1974 | Basse | 307/238 |
| 3,851,186 | 11/1974 | Koo | 307/205 |
| 3,909,808 | 9/1976 | Cochran et al. | 340/173 |
| 3,976,892 | 8/1976 | Buchanan | 307/205 |
| 3,995,171 | 11/1976 | Sonoda | 307/205 |
| 4,011,549 | 3/1977 | Bormann | 340/173 |
| 4,027,174 | 5/1977 | Ogata | 307/205 |
| 4,074,237 | 2/1978 | Spampinato | 365/230 |
| 4,086,500 | 4/1978 | Suzuki et al. | 307/270 |
| 4,099,162 | 7/1978 | von Basse | 340/166 |
| 4,124,900 | 11/1978 | Smith et al. | 365/72 |
| 4,185,320 | 1/1980 | Takemae et al. | 365/203 |
| 4,194,130 | 3/1980 | Moench | 307/205 |
| 4,247,921 | 1/1981 | Itoh et al. | 365/233 |

*Primary Examiner*—Terrell W. Fears
*Attorney, Agent, or Firm*—John J. Goodwin

[57] ABSTRACT

Word line CMOS decoder and driver circuits for semiconductor memories wherein the pitch of the decoder is twice that of the word line, the number of decoders required is reduced by a half, and the word line selection pulse can be applied prior to word line selection. The decoder and driver circuits include a transistor clock load device having its gate electrode driven by a decoder clock pulse or address pulse and a plurality of decoder address switch devices having their gate electrodes driven, respectively, by a plurality of address signals. The clock load device and the address switch devices are connected to a common node at the input to an inverter stage.

10 Claims, 6 Drawing Figures

WORD LINE DECODER AND DRIVER CIRCUITS FOR HIGH DENSITY SEMICONDUCTOR MEMORY

BACKGROUND OF THE INVENTION

1. Field of Invention

This invention relates to word line decoders and drivers for semiconductor memory storage systems, and more particularly to high speed, low power decoder apparatus with very small pitch compatible with the small word line pitch of a high density semiconductor memory.

2. Description of Prior Art

The present invention teaches a word line decoder and driver circuits for semiconductor memories wherein the pitch of the decoder is twice that of the word line, the number of decoders required is reduced by a half, and the word line selection pulse can be applied prior to word line selection. The prior art includes many various schemes and structures for memory decoder and driver circuits, but none having the above features embodied as in the present invention.

Representative prior art references are as follows:

U.S. Pat. No. 3,995,171 issued Nov. 30, 1976 to G. Sonoda and entitled DECODER DRIVER CIRCUIT FOR MONOLITHIC MEMORIES describes a decode circuit for word lines. A discharge path is provided for discharging the word lines to prevent false selection and improving timing.

U.S. Pat. No. 3,757,310 issued Sept. 4, 1973 to B. F. Croxon and entitled MEMORY ADDRESS SELECTION APPARATUS INCLUDING ISOLATION CIRCUITS describes an address selection structure with buffer circuits responsive to clocking signals. Each of the buffer circuits is arranged to translate low level logic address signals applied to its input terminal into a pair of high level complementary signals suitable for driving a pair of address selection lines applied to the input terminals of the decoder circuits. Prior to address selection time, a clock signal conditions the buffer to set the address line in a first state. During address selection time, a clocking signal conditions each of the buffer circuits to switch only one address selection line of each pair of lines from a first state to a second state in accordance with the state of the low level address information signal applied to its input terminal. This causes each of the decoder circuits which has one of its input terminals forced to a second state to discharge rapidly from the first predetermined state to a second predetermined state with only the addressed decoder circuits remaining at the first predetermined state.

U.S. Pat. No. 4,194,130 issued Mar. 18, 1980 to J. D. Moench and entitled DIGITAL PREDECODING SYSTEM describes an address predecoder provided in combination with an address decoder. The predecoder permits a reduction in the number of transistors used in the decoder which is preferably a MOS device NOR gate.

U.S. Pat. No. 3,909,808 issued Sept. 30, 1975 to Cochran et al and entitled MINIMUM PITCH MOSFET DECODER CIRCUIT CONFIGURATION describes a MOSFET decoder circuit configuration for enhancing read/only storage memory densities by providing decoded output lines on a narrower pitch than conventional decoder circuits, thereby increasing the number of decoded lines of the conventional decoder. In addition, the number of conventional decoder circuits required are reduced by a binary factor, thereby decreasing power requirements. Decoded line capability is increased by means of properly addressed array select devices whereby the number of array select devices required is equal to the particular binary factor utilized. The binary factor is chosen so that the decoder pitch is equal to the read/only storage memory pitch in order to obtain maximum chip density. This circuit uses n-MOS technology and employs selected pass gates between the decoder and the memory.

U.S. Pat. No. 3,778,782 issued Dec. 11, 1973 to N. Kitagawa and entitled IGFET DYNAMIC ADDRESS DECODE CIRCUIT describes a high speed, low power address decode circuit which exhibits zero static power loss and increased packing density. To provide generally faster dynamic operation, the circuit precharges line and inherent capacitance prior to application of the data pulses.

U.S. Pat. No. 4,124,900 issued Nov. 7, 1978 to Smith et al, and entitled MEMORY USING INTERLEAVED ROWS TO PERMIT CLOSER SPACING describes an array of memory cells composed of variable threshold field effect transistors, means for writing and reading information into and out of the array which includes precharged circuitry to provide predetermined voltages on the gate, source and drain electrodes of the transistors in the array before writing or reading and row decode circuitry on both sides of the array to permit closer spacing of the variable threshold transistors in the array.

U.S. Pat. No. 3,851,186 issued Nov. 26, 1974 to J. T.-Z. Koo and entitled DECODER CIRCUIT describes a conventional MOS binary-to-one-out-of-N decoder which is modified to reduce the number of MOS devices associated with each of the N output lines of the unit. Additionally, the power consumption per output line of the modified decoder is less than that of the conventional unit.

Other prior art references in the general area of memory decoders and/or drivers includes U.S. Pat. No. 3,976,892 issued Aug. 24, 1976 to J. K. Buchanan, and entitled PRE-CONDITIONING CIRCUITS FOR MOS INTEGRATED CIRCUITS, U.S. Pat. No. 4,027,174 issued May 31, 1977 to Y. Ogata, and entitled DYNAMIC DECODER CIRCUIT, U.S. Pat. No. 4,185,320 issued Jan. 22, 1980 to Takemae et al, and entitled DECODER CIRCUIT, U.S. Pat. No. 3,786,277 issued Jan. 15, 1974 to P.-W. V. Basse and entitled CIRCUIT ARRANGEMENT OF MOS TRANSISTORS OPERATING ACCORDING TO THE DYNAMIC PRINCIPLE FOR DECODING THE ADDRESSES FOR AN MOS MEMORY, U.S. Pat. No. 4,247,921 issued Jan. 27, 1981 to Itoh et al, and entitled DECODER, U.S. Pat. No. 4,099,162 issued July 4, 1978 to P.-W. von Basse and entitled DECODER CIRCUIT, U.S. Pat. No. 4,086,500 issued Apr. 25, 1978 to Suzuki et al, and entitled ADDRESS DECODER, U.S. Pat. No. 3,641,511 issued Feb. 8, 1972 to Cricchi et al, and entitled COMPLEMENTARY MOSFET INTEGRATED CIRCUIT MEMORY, U.S. Pat. No. 4,011,549 issued Mar. 8, 1977 to A. R. Bormann, and entitled SELECT LINE HOLD DOWN CIRCUIT FOR MOS MEMORY DECODER, U.S. Pat. No. 4,074,237 issued Feb. 14, 1978 to D. P. Spampinato, and entitled WORD LINE CLAMPING CIRCUIT AND DECODER.

SUMMARY OF THE INVENTION

MOSFET technology provides low cost, high reliable yields. A desirable feature of MOSFET design is to provide the ability to integrate more and more functions on a given chip size.

A series of AND gates or a series of NOR gates, which are the complement of AND gates, are used for decoding of logical input signals, to address memory matrices. As an example, for each group of AND circuits, hereinafter called AND blocks or conventional decoders, there is provided a plurality of logical input signals, depending on the operation to be performed, and there is one output decoded line for each conventional decoder. Associated with each conventional decoder is also a clock pulse input to provide the necessary switching logic for the proper operation of the devices. The conventional decoder blocks, aforementioned, are commonly used in the MOSFET large scale integration technology to provide addressing or accessing signals for storage memory arrays. In past applications, where decoders and memories were fabricated on the same chip, the density of the memory was limited by the physical size of the address decoder. To put it another way, the number of address lines for the memory was limited by the number of decoded output lines available from the conventional decoders for a particular chip size wherein the spacing between the decoded output lines is referred to as "pitch". Consequently, using MOSFET technology ground rules suitable for maximum density memory fabrication put a restriction on the minimum pitch-minimum array dimensions achievable with these ground rules using conventional decoders, the limitation being the minimum pitch dimension of the conventional decoders. The result was that full memory capability could not be utilized because the number of decoder circuits necessary to fully utilize the memory storage capacity could not be fabricated on the same chip. Accordingly, to fully utilize the memory densities, more chips were needed. In addition, since the minimum pitch dimensions for the conventional decoders and the memories were not compatible, jogging the interconnecting or decoded lines on the chips were necessary, thus losing the use of valuable chip areas.

Accordingly, An object of the present invention is to provide word line decoder and driver circuits for high density semiconductor memories.

Another object of the present invention is to provide a high speed, low power decoder circuit with very small pitch compatible with a small word line pitch, high density semiconductor memory.

A further object of the present invention is to provide a decoder circuit for a high density semiconductor memory which permits the word line selection pulse to be applied before the word line selection is made.

Still another object of the present invention is to provide a word line decoder and driver structure wherein a reduced number of decoder circuits are required.

The foregoing and other objects, features and advantages of this invention will be apparent from the following more particular description of the invention, as illustrated in the accompanying drawings.

BRIEF DESCRIPTION OF THE DRAWINGS

The details of the invention will be described in connection with the accompanying drawings.

DESCRIPTION OF THE PREFERRED EMBODIMENTS

Figure 1:
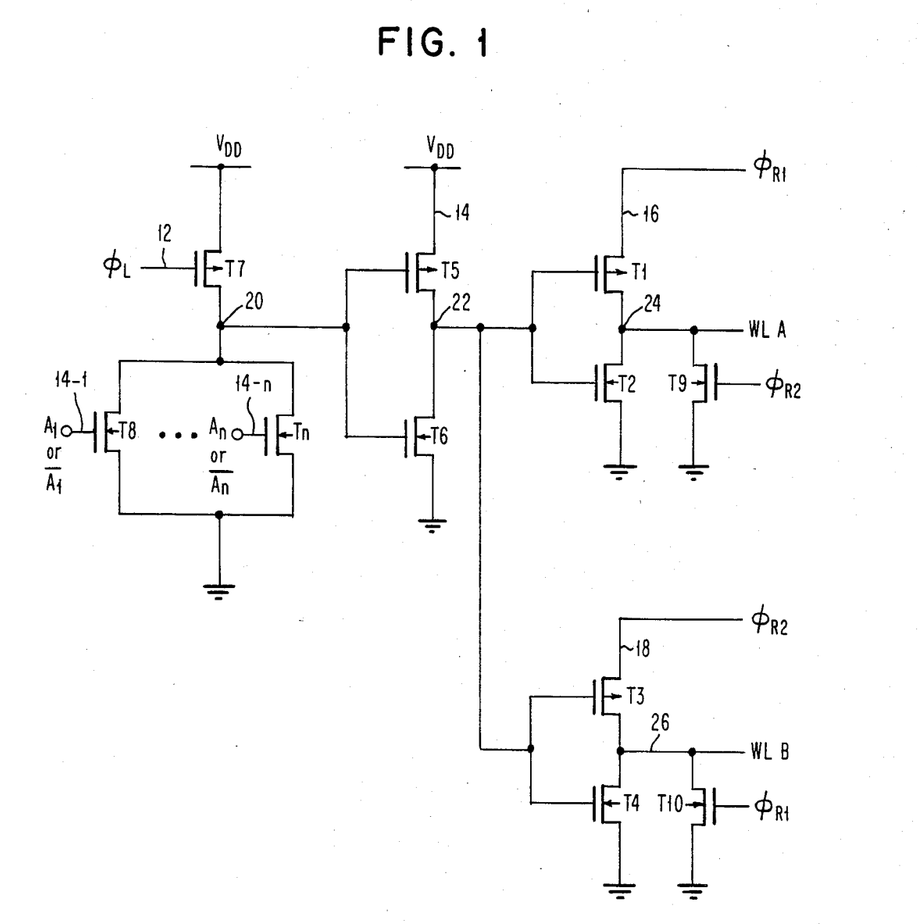
FIG. 1 is a schematic illustration of an embodiment of a CMOS word line decoder and driver for a semiconductor circuit storage system with memory cells which uses n-channel MOSFET transfer devices according to the principles of the present invention.
Figure 2:
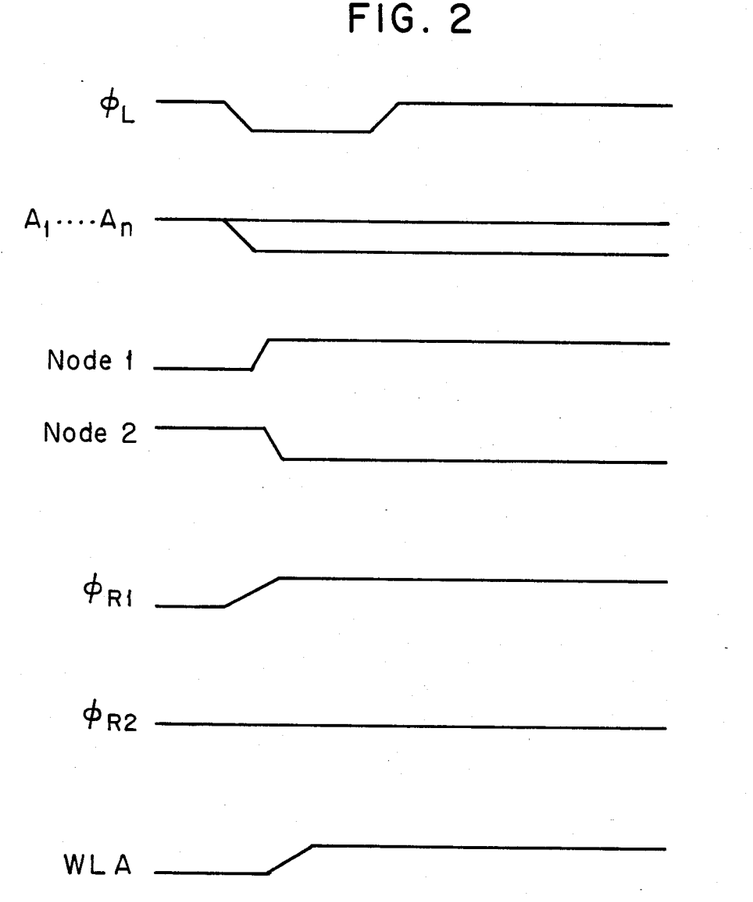
FIG. 2 is an illustration of signal waveforms useful in explaining the operation of the embodiment of FIG. 1.

FIG. 1 shows a schematic circuit diagram of one embodiment of high speed, low power and small pitch CMOS decoders and drivers used for memory cells with n-MOSFET transfer devices. FIG. 2 illustrates the operating waveforms of the circuit of FIG. 1 and should be employed with FIG. 1 to understand the operation of the embodiment of FIG. 1. In FIG. 1, the decoder and circuit includes transistor T7 which is a clock load device having its source electrode connected to a positive voltage supply $V_{DD}$, its gate electrode driven by a decoder clock pulse $\phi_L$ on line 12 and its source electrode connected to node 20. Included in the decoder are a plurality of decoder address switch devices 14-1 through 14-n having their drain electrodes connected to node 20, their source electrodes connected to ground and their gate electrodes driven, respectively, by plurality of address signals $A_1$ through $A_n$ (or $\overline{A}_1$ through $\overline{A}_n$). The source of the clock pulse $\phi_L$ on line 12, as well as the other clock pulses to be later described, is not shown because the design of an external system clock is known to anyone with ordinary skill in the art.

Node 20 is connected to the gate electrode of devices T5 and T6 which function as inverters. The operation of the circuit of FIG. 1 is as follows. Initially, at standby condition, clock line $\phi_L$ (line 12) and all address lines 14-1 through 14-n are biased at voltage $V_{DD}$. Row clock lines $\phi_{R1}$ and $\phi_{R2}$, (lines 16 and 18 respectively), are both at ground potential. In this example, node 20 is at ground potential and node 22 is at a voltage of $V_{DD}$. All word lines 24 and 26 (i.e. WL A and WL B) are actively held to ground potential. Next, the address lines 14-1 through 14-n fall selectively and $\phi_L$ line 12 falls to activate the NOR decoder formed by transistor devices T7 and T8 to Tn. Consider the case that all address lines 14-1 through 14-n connected to transistor devices T8 to Tn fall to ground, whereby node 20 will be charged up to voltage level $V_{DD}$. At the same time, one of the row clock lines, for example ($\phi_{R1}$) on line 16, is selected and rises to voltage $V_{DD}$. Since this can be done in parallel to the decoding operation, the rise time of the row clock does not cause any delay. Next, the potential at node 22 falls to ground and both transistor devices T1 and T3 are turned on. Word line 24 will be charged up to voltage $V_{DD}$ and word line 26 will be held at ground by clamping transistor T10 which is controlled by $\phi_{R2}$, the row clock line 18. Finally, signal $\phi_L$ on line 12 returns to voltage $V_{DD}$ to power down the decoder after node 20 charged up to voltage $V_{DD}$. Since this will not affect the potential at node 20, this can be done before word line 24 rises to voltage $V_{DD}$.

With this arrangement, the pitch of the decoder is twice that of the word line and thus, can fit into the narrow word line pitch of high density memory. The number of decoders are reduced to half, thus, reducing the power consumption. More than two row clocks can also be implemented to further reduce the number of decoders required, thus, reduce power consumption. The speed of this circuit is higher than that of the conventional decoder and driver because all heavily loaded address lines are selectively pull down types rather than pull up types and the rise time of the row clock has no impact on the delay. By interchanging p-channel MOSFET devices and n-channel MOSFET devices and the $V_{DD}$ and ground, the concepts and techniques of the circuit of FIG. 1 can be used for word line decoder and drivers memory cells with p-channel MOSFET transfer device.

Figure 3:
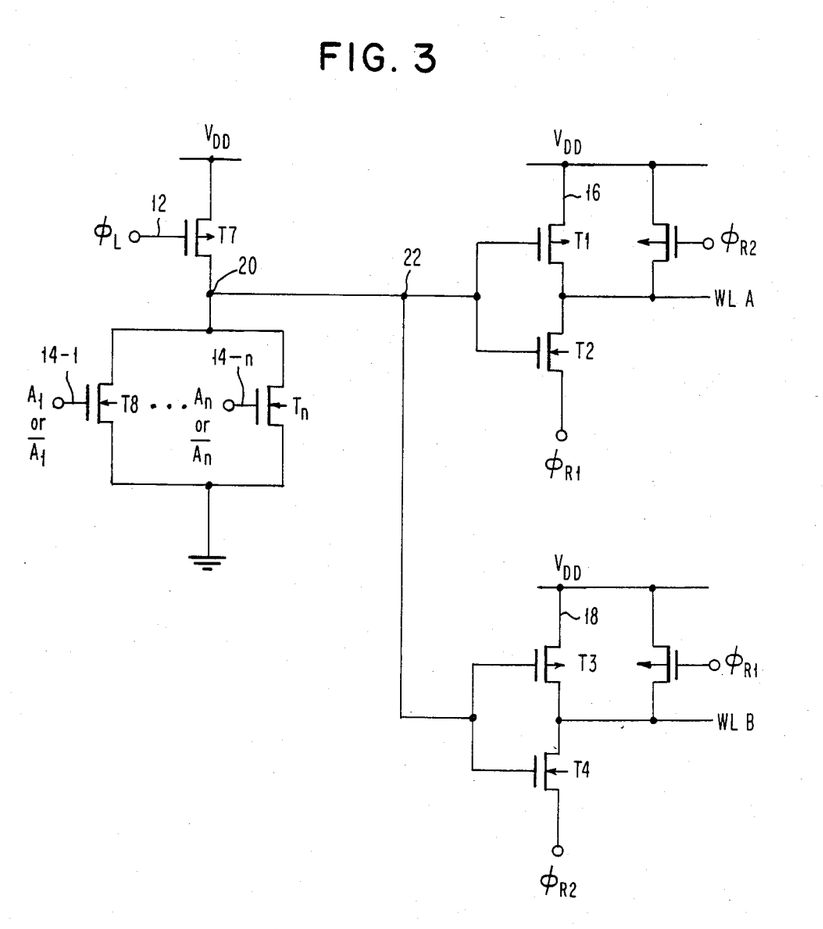
FIG. 3 is a schematic illustration of another embodiment of a CMOS word line decoder and driver circuit for memory system with memory cells which uses p-channel MOSFET transfer devices.
Figure 4:
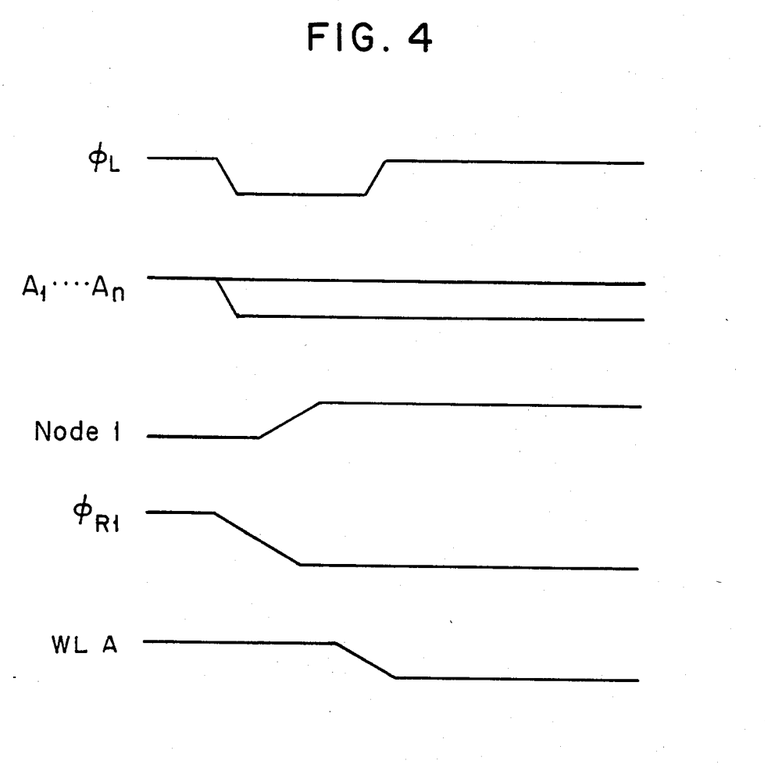
FIG. 4 is an illustration of signal waveforms useful in explaining the operation of the embodiment of FIG. 3.
Figure 5:
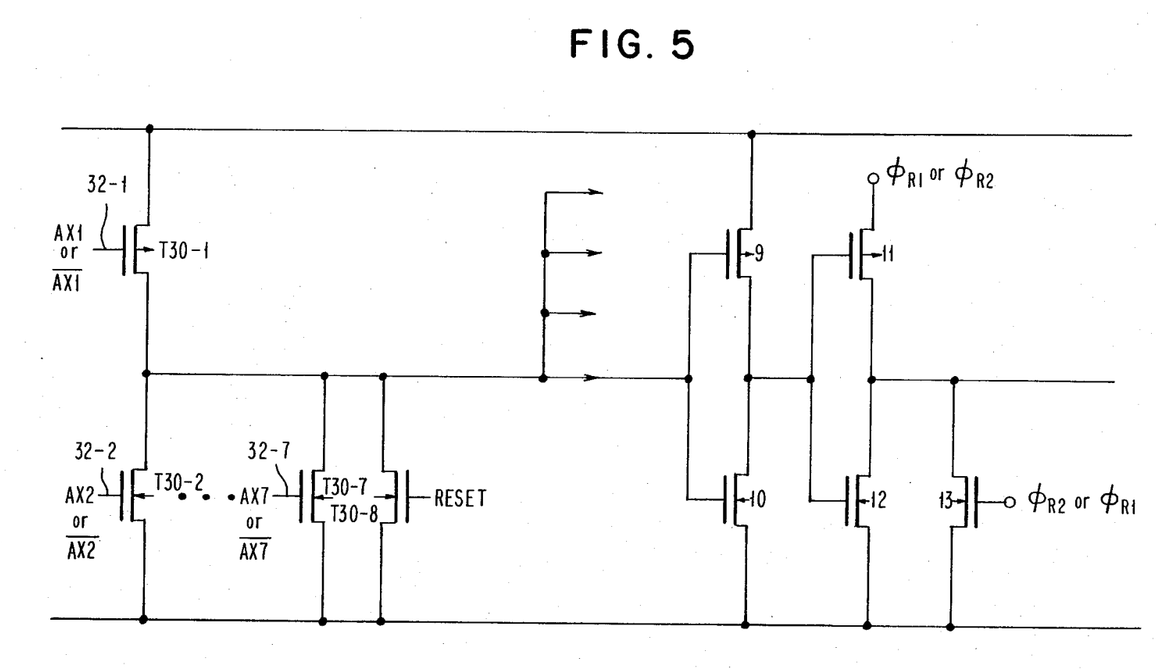
FIG. 5 is a schematic illustration of another embodiment of an x-decoder and driver using less d.c. power than the embodiments of FIGS. 1.

The schematic circuit diagram and operating waveforms for such CMOS word line decoder and driver for use with memory with p-channel MOSFET transfer device are shown in FIGS. 3 and 4 respectively. With minor modifications, the d.c. power of the circuits of FIGS. 1 and 3 can be further reduced. The x-decoder circuit of FIG. 1 is modified as shown in FIG. 5. In FIG. 5, devices T30-1 and T30-2 through T30-7 form a NOR decoder with device T30-1 functioning as a p-load device. Devices T9, T10 and T11, T12 function as inverters and device T13 functions as a pull-down transistor. The gate electrode of the p-channel load FET T30-1 is connected to AX1 or $\overline{AX1}$ rather than the $\phi_L$ clock as is transistor device T7 in FIG. 1. At standby, all address lines 32-1 through 32-7 are reset to $V_{DD}$ voltage, thus load FET T30-1 is turned off and there is no d.c. power consumption. The output of the decoder is set to ground potential. When the address buffers are activated by the chip select clock, half of the decoders are activated when AX1 (or $\overline{AX1}$) is discharged to ground, thus turning on the p-channel load. The output of the selected decoder with all low input charges to $V_{DD}$. When the output of this decoder rises to $V_{DD}$ voltage, the load device can be turned off and the output will be held dynamically. Therefore, at this time, AX1 (or $\overline{AX1}$) can be reset to $V_{DD}$ voltage to minimize the d.c. power. To implement this, the circuits of the address buffer for AX1 and $\overline{AX1}$ should be modified. It is activated only when both the chip select not clock and the output of a dummy decoder are at ground potential. Therefore, when the output of the dummy decoder is charged up, it resets AX1 and $\overline{AX1}$ to $V_{DD}$. At the end of the cycle, the dummy decoder output and all other decoder outputs are reset to ground by RESET clock. This allows the address buffer to be able to be activated by the chip select clock at next cycle.

Figure 6:
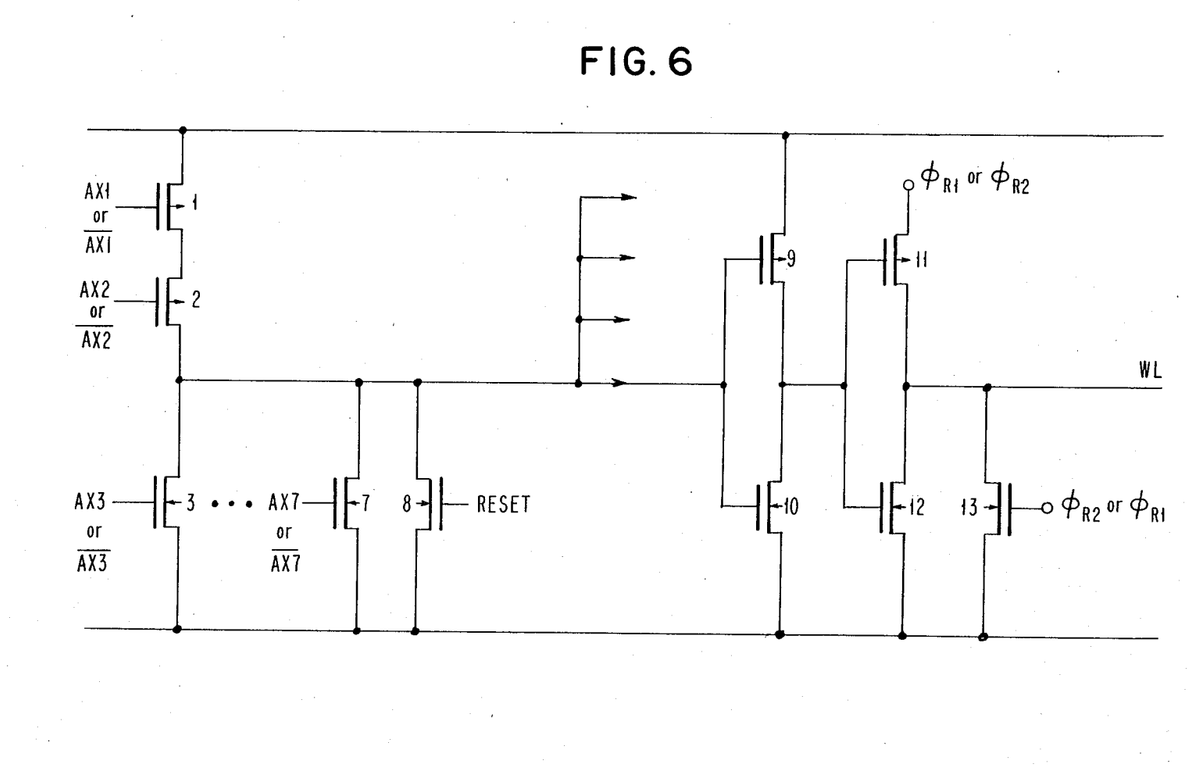
FIG. 6 is a schematic illustration of still another embodiment of an x-decoder and driver using even less d.c. power than the embodiments of FIGS. 1 and 5.

With other modifications, the d.c. power of the x-decoders can be further reduced. The circuit is shown in FIG. 6. The load is formed by two p-channel FET's in series. The gate of these devices are connected to AX1 and AX2 or their complements. Therefore, only one out of four decoders will be activated (AND decoding), thus further reduce the power consumption.

Similar implementation for FIG. 3 can be achieved by embodiments based on the same principle.

Having thus described our invention, what we claim as new, and desire to secure by Letters Patent is:

1. A narrow pitch CMOS word line decoder and driver circuit configuration for a semiconductor memory device comprising:
   a system clock circuit for generating clock pulses;
   a system voltage supply;
   a decoder circuit including at least one p-type transistor having a source electrode connected to said voltage supply, a gate electrode connected to gating signals and a drain electrode connected to a first node, and a plurality of n-type address switch transistors, each having a drain electrode connected to said first node, a source electrode connected to ground voltage and a gate electrode connected to a separate one of a plurality of input address signals;
   an inverter circuit including a pair of transistors, a first one of said pair of transistors having a source electrode connected to said voltage supply, a second one of said pair of transistors having a source electrode connected to ground voltage, said first and second inverter transistors having gate electrodes connected in common to said first node and drain electrodes connected in common to a second node; and
   means connecting said second node to word lines of said semiconductor memory device.

2. A narrow pitch CMOS word line decoder and driver circuit configuration according to claim 1 wherein said gating signals connected to said at least one p-type transistor are clock pulses generated by said system clock circuit.

3. A narrow pitch CMOS word line decoder and driver circuit configuration according to claim 1 wherein said gating signals connected to said at least one p-type transistor are input address signals.

4. A narrow pitch CMOS word line decoder and driver circuit configuration according to claim 2 wherein said means connecting said second node to said word lines includes a pair of push-pull transistors having drain electrode connected in common to each of said word lines, having gate electrodes connected in common to said second node, and a source electrode of one transistor of each of said pair of transistors being connected to row clock pulses from said system clock circuit.

5. A narrow pitch CMOS word line decoder and driver circuit configuration according to claim 2 wherein said means connecting said second node to said word lines includes a first pair of push-pull transistors having drain electrodes connected in common to a first word line; gate electrodes connected in common to said second node, the source electrode of one of said first pair of push-pull transistors connected to first row clock pulses from said system clock circuit and the source electrode of said other transistor of said first pair connected to ground voltage;

and a second pair of push-pull transistors having drain electrodes connected in common to a second word line, gate electrodes connected in common to said second node, the source electrode of one of said second pair of push-pull transistors connected to second row clock pulses from said system clock circuit and the source electrode of said other transistor of said second pair connected to ground voltage.

6. A narrow pitch CMOS word line decoder and driver circuit configuration according to claim 2 wherein said means connecting said second node to said word lines includes a first pair of push-pull transistors having drain electrodes connected in common to a first word line; gate electrodes connected in common to said second node, the source electrode of one of said first pair of push-pull transistors connected to first row clock pulses from said system clock circuit and the source electrode of said other transistor of said first pair connected to said system voltage supply;

and a second pair of push-pull transistors having drain electrodes connected in common to a second word line, gate electrodes connected in common to said second node, the source electrode of one of said second pair of push-pull transistors connected to second row clock pulses from said system clock circuit and the source electrode of said other transistor of said second pair connected to said system voltage supply.

7. A narrow pitch CMOS word line decoder and driver circuit configuration according to claim 4 further including a clamping transistor connected to each of said word lines and having a gate electrode connected to said system clock circuit and responsive to said clock pulses.

8. A narrow pitch CMOS word line decoder and driver circuit configuration according to claim 5 wherein further including a first clamping transistor connected to said first word line including a drain electrode connected to said first word line, a gate electrode connected to said second row clock pulses from said system clock circuit and a source electrode connected to ground voltage; and a second clamping transistor connected to said second word line including a drain electrode connected to said second word line, a gate electrode connected to said first row clock pulses from said system clock circuit and a source electrode connected to ground voltage.

9. A narrow pitch CMOS word line decoder and driver circuit configuration according to claim 5 wherein further including a first clamping transistor connected to said first word line including a drain electrode connected to said first word line, a gate electrode connected to said second row clock pulses from said system clock circuit and a source electrode connected to said ground system voltage supply; a second clamping transistor connected to said second word line including a drain electrode connected to said second word line, a gate electrode connected to said first row clock pulses from said system clock circuit and a source electrode connected to said system voltage supply.

10. In a narrow pitch CMOS word line decoder and driver circuit configuration for a semiconductor memory device characterized in having:

a system clock circuit for generating clock pulses;

a system voltage supply for producing a voltage $V_{DD}$;

a decoder circuit including at least one p-type transistor having a source electrode connected to said voltage supply, a gate electrode connected to said clock circuit and responsive to line clock pulses therefrom and a drain electrode connected to a first node, and a plurality of n-type address switch transistors, each having a drain electrode connected to said first node, a source electrode connected to ground voltage and a gate electrode connected to a separate one of a plurality of input address signals;

an inverter circuit including a pair of transistors, a first one of said pair of transistors having a source electrode connected to said voltage supply, a second one of said pair of transistors having a source electrode connected to ground voltage, said first and second inverter transistors having gate electrodes connected in common to said first node and drain electrodes connected in common to a second node; and means connecting said second node to said word lines includes a first pair of push-pull transistors having drain electrodes connected in common to a first word line; gate electrodes connected in common to said second node, the source electrode of one of said first pair of push-pull transistors connected to first row clock pulses from said system clock circuit and the source electrode of said other transistor of said first pair connected to ground voltage;

and a second pair of push-pull transistors having drain electrodes connected in common to a second word line, gate electrodes connected in common to said second node, the source electrode of one of said second pair of push-pull transistors connected to second row clock pulses from said system clock circuit and the source electrode of said other transistor of said second pair connected to ground voltage; a method of providing decoder signals including the steps of:

(1) initially biasing the input to said drain electrode of said p-type transistor, said plurality of input address signals and said second node at said VDD voltage and biasing said first and second row clock pulses, said first and second word lines and said first node at ground voltage:

(2) causing one or more of said plurality of input address signals and said line clock pulse to go to ground voltage whereby said first node and one of said row clock pulses rises to voltage $V_{DD}$;

(3) causing said second node to go to ground voltage thereby turning on one transistor in each of said first and second pairs of push-pull transistors;

(4) causing one of said word lines to rise to voltage $V_{DD}$ and the other of said word line to remain at ground voltage;

(5) and causing said line clock pulse to return to voltage $V_{DD}$ prior to said word line rising to voltage $V_{DD}$ in step 4.

* * * * *